United States Patent
Liu et al.

(10) Patent No.: US 7,858,973 B2
(45) Date of Patent: Dec. 28, 2010

(54) POLYMER COMPOSITE P-N JUNCTION AND METHOD FOR MANUFACTURING SAME AND POLYMER COMPOSITE DIODE INCORPORATING SAME

(75) Inventors: Chang-Hong Liu, Beijing (CN); Shou-Shan Fan, Beijing (CN)

(73) Assignees: Tsinghua University, Beijing (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 413 days.

(21) Appl. No.: 11/874,856

(22) Filed: Oct. 18, 2007

(65) Prior Publication Data

US 2009/0032806 A1 Feb. 5, 2009

(30) Foreign Application Priority Data

Oct. 18, 2006 (CN) .................. 2006 1 0063190

(51) Int. Cl.
*H01L 35/24* (2006.01)
*H01L 51/00* (2006.01)
(52) U.S. Cl. .................. 257/40; 257/E51.04
(58) Field of Classification Search .......... 257/40, 257/E51.04
See application file for complete search history.

(56) References Cited

U.S. PATENT DOCUMENTS

| 6,656,609 | B2 | 12/2003 | Takahashi et al. | |
| 6,784,017 | B2 | 8/2004 | Yang et al. | |
| 6,887,592 | B2 | 5/2005 | Hieda et al. | |
| 7,061,010 | B2 | 6/2006 | Minakata | |
| 2003/0190772 | A1* | 10/2003 | Toyota et al. | 438/200 |
| 2004/0061107 | A1* | 4/2004 | Duggal | 257/40 |
| 2006/0006378 | A1* | 1/2006 | Hirai | 257/40 |
| 2006/0065888 | A1 | 3/2006 | Lazarev | |

FOREIGN PATENT DOCUMENTS

TW 200412182 7/2004

OTHER PUBLICATIONS

H.S.Woo et al, Organic light emitting diodes fabricated with single wall carbon nanotubes dispersed in a hole conducting buffer: the role of carbon nanotubes in a hole conducting polymer,Synthetic Metals,2001,369-372,116.

* cited by examiner

*Primary Examiner*—Eugene Lee
*Assistant Examiner*—Anthony Ho
(74) *Attorney, Agent, or Firm*—Jeffrey T. Knapp

(57) ABSTRACT

The present polymer composite p-n junction includes an n-type polymer composite layer and a p-type polymer composite layer. The n-type composite polymer layer includes a first polymer material and a number of electrically conductive particles imbedded therein. The p-type composite polymer layer includes a second polymer material and a number of carbon nanotubes (CNTs) imbedded therein. A method for manufacturing the polymer composite p-n junction and a polymer composite diode incorporating the polymer composite p-n junction are also provided.

5 Claims, 4 Drawing Sheets

POLYMER COMPOSITE P-N JUNCTION AND METHOD FOR MANUFACTURING SAME AND POLYMER COMPOSITE DIODE INCORPORATING SAME

BACKGROUND OF THE INVENTION

1. Field of the Invention

The invention relates to a polymer composite p-n junction and its method of manufacture and also relates to a polymer composite diode incorporating the polymer with p-n junctions.

2. Description of Related Art

Carbon nanotubes (CNTs), including multiple concentric shells, were first discovered by Iijima in 1991 (Nature, Vol. 354, Nov. 7, 1991, pp. 56-58). Subsequent to this discovery, single-wall carbon nanotubes (SWNTs), including a single graphene layer (i.e., the 2-D equivalent of graphite) rolled up on itself, were synthesized in an arc-discharge process using carbon electrodes doped with transition metals. The carbon nanotubes (especially SWNTs) possess exceptional mechanical, electrical, and thermal properties, and such properties make them attractive for the next generation of composite materials. CNTs are expected to serve as mechanical reinforcements for lightweight composite systems with further promise of multi-functionality. For instance, SWNTs possess a tensile strength of 50-100 GPa and a modulus of 1-2 Tpa—five and ten times greater than steel, respectively, at just one-sixth the weight. CNTs not only have the desirable properties of carbon fibers but are also much more flexible and can be compressed without fracturing. Such excellent mechanical properties make such materials candidates for applications such areas as low-cost and flexible organic electronics, either for their mechanical behavior alone or in conjunction with other desirable properties thereof. However, the potential of using nanotubes as polymer composite reinforcements has, heretofore, not been realized, mainly because of the difficulties in processing and the limitation on electrical properties like low carrier density and mobility of transferring. Several industrial practice challenges must be overcome in order to fully enable such reinforcement by nanotubes.

Some strategies have been proposed to overcome the various barriers to achieving adequate dispersion, including the use of ultrasonication, high-shear mixing, surfactant addition, chemical modification through wrapping the tubes with polymer chains, and various combinations of these. However, to date, only marginal success for nanotube reinforced epoxy composites has been realized, mostly due to the above-mentioned barrier to achievement of sufficient dispersion.

What is needed, therefore, is not only methods for the large-scale manufacture of polymer with carbon nanotubes composites, in which is the polymer composite p-n junction with organic agents and the polymer composite diode incorporates flexible and lightweight p-n junctions, but also to enhance electrical properties like carrier density and mobility.

SUMMARY OF THE INVENTION

A material of an electrically conducting polymer composite with p-n junctions is provided. In this invention, an electrically conducting polymer composite p-n junction comprising an electron-doped, and n-type polymer composite layer comprising a first polymer material and a plurality of electrically conductive particles dispersed and imbedded therein. A hole-doped, p-type polymer composite layer comprising a second polymer material and a plurality of carbon nanotubes (CNTs) well dispersed and imbedded therein. The p-type polymer composite layer is formed in contact with the n-type polymer composite layer.

A production method of the electrically-conducting polymer composite with p-n junctions includes the steps of: (a) providing a substrate; (b) applying a p-type composite polymer layer onto the substrate, the p-type composite polymer layer being a mixture of a second polymer and a plurality of carbon nanotubes (i.e., CNTs); (c) applying a n-type composite polymer layer onto the p-type composite polymer layer, the n-type composite polymer layer being a mixture of a first polymer and a plurality of electrically conductive particles; and (d) stripping away the n-type composite polymer layer and p-type composite polymer layer, together as a unit, from the substrate.

An polymer composite diode incorporating the polymer composite with p-n junctions is provided, including both an n-type polymer composite layer and a p-type polymer composite layer. The n-type composite polymer layer includes a first polymer material and a plurality of electrically conductive particles well dispersed and imbedded therein. The p-type composite polymer layer includes a second polymer material with a plurality of carbon nanotubes (CNTs) well dispersed and imbedded therein. The cathode and anode of the polymer composite diode can, advantageously, be made of gold.

Compared to the related art, the methods for large-scale manufacturing of such a conducting polymer composite p-n junction can be easily realized through any of spin-coating, spray-applying, and printing. The p-n junction has greater conductivity and better mechanical properties as a result of using the CNTs in one of the two layers thereof.

Other advantages and novel features of the present polymer composite will become more apparent from the following detailed description of preferred embodiments, when taken in conjunction with the accompanying drawings.

BRIEF DESCRIPTION OF THE DRAWINGS

The components in the drawing are not necessarily drawn to scale, the emphasis instead being placed upon clearly illustrating the principles of the present electrically-conducting polymer composite.

Figure 1:
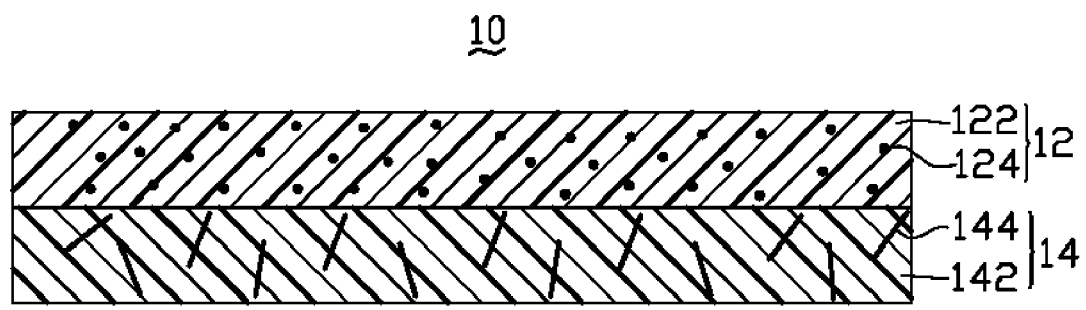
FIG. 1 is a schematic, cutaway view of a conducting polymer composite p-n junction in accordance with a present embodiment of the present electrically-conducting polymer composite.

Corresponding reference characters indicate corresponding parts. The exemplifications set out herein illustrate at least one preferred embodiment of the present electrically-conducting polymer composite, and such exemplifications are not to be construed as limiting the scope of the invention in any manner.

DETAILED DESCRIPTION OF THE INVENTION

Reference will now be made to the drawings to describe, in detail, embodiments of the present electrically-conducting polymer composite.

Referring to FIG. 1, a first present embodiment provides an electrically conducting polymer composite 10 with p-n junctions. The polymer composite 10 includes an electron-doped (n-type) polymer composite layer 12 and hole-doped (p-type) polymer composite layer 14 positioned directly on the n-type composite layer. The n-type composite polymer layer 12 includes first polymer material 122 with electrically conductive particles 124 well-dispersed and imbedded therein. The p-type composite polymer layer 14 includes a second polymer material 142 and plural carbon nanotubes (CNTs) 144 well-dispersed and imbedded therein.

The thicknesses of the n-type polymer composite layer 12 and the p-type polymer composite layer 14 are each in an approximate range from ten micrometers to 0.2 millimeters. The first polymer material 122 in the n-type composite polymer layer 12 and the second polymer material 142 in the p-type composite polymer layer 14 can be made of identical or different materials. The first polymer material 122 and the second polymer material 142 are made of at least one material chosen from a group consisting of polyethylene-ethylene glycol (PE-EG), polyethylene terephthalate (PET), silicone, epoxy resin, anaerobic glue, and acrylic glue.

The CNTs 144 used in the p-type polymer composite layer 14 can, potentially, be replaced at least in part, with fullerene particles, carbon black particles, and/or carbon fibers. It is, however, to be understood that CNTs have shown to be quite useful for this application, given their favorable mechanical and electrical properties. Advantageously, the lengths of the CNTs 144 are in approximate range from 200 nanometers to 20 micrometers, the diameters are around 0.5-200 nanometers, and the compositional weight of CNTs is 0.01-30 wt % (percentage by weight, relative to the p-type polymer composite layer 14). The optimized weight of CNTs is about 0.1-4 wt %. Quite usefully, the lengths of the CNTs 144 are about 10 micrometers, the diameters of the CNTs 144 are about 10 nanometers, and the weight amount of CNTs 144 is about 1 wt % in these embodiments. If the weight of CNTs 144 is less than 0.01 wt %, the electrical conductivity of p-type composite polymer layer 14 is close to that of an insulator. If the weight of CNTs 144 is larger than 30 wt %, the electrical conductivity of p-type composite polymer layer 14 is close to that of a conductor.

The plural electrically conductive particles 124 in the n-type polymer composite layer 12 can be made of any various electrically conductive materials (e.g., metals, conductive ceramics, semiconductors), chosen help achieve the desired conductance level in the n-type polymer composite layer 12. The plural electrically conductive particles 124 are, in one specific example, zinc oxide particles, occupying approximately 30-50 wt % of the n-type polymer composite layer 12.

The plural electrically conductive particles 124 in the n-type polymer composite layer 12 provide the electron carriers. The electrically conductive particles 124 are, beneficially, made of an inorganic, electrically conductive material with a high electrical/charge density and a high electrical (e.g., in terms of charge and/or electron) mobility. The CNTs 144 in the p-type composite polymer layer 14 include the hole-doped carriers which enhance not only the charge density and the mobility of electrons but also the heat conductivity and mechanical properties. In this way it is able to improve the heat stability of the p-n junction.

Figure 2:
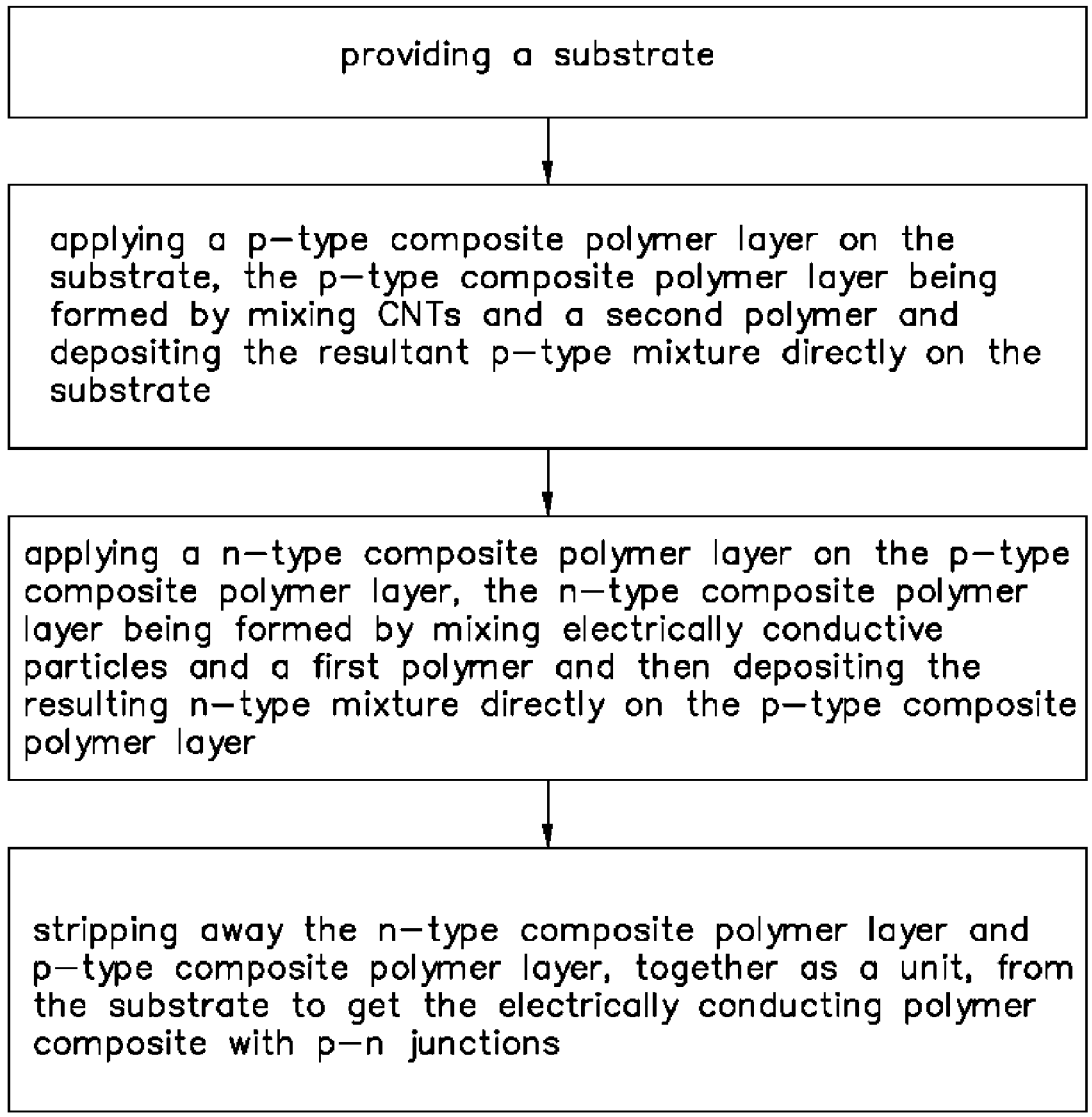
FIG. 2 is a flow chart of a method for manufacturing the conducting polymer composite p-n junction of FIG. 1.

Referring to FIG. 2, a flow chart provides a method for manufacturing a conducting polymer composite 10 with p-n junctions, the method including the steps of:

(a) providing a substrate;

(b) applying a p-type composite polymer layer on the substrate, the p-type composite polymer layer being formed by mixing CNTs and a second polymer and depositing the resultant p-type mixture directly on the substrate;

(c) applying a n-type composite polymer layer on the p-type composite polymer layer, the n-type composite polymer layer being formed by mixing electrically conductive particles and a first polymer and then depositing the resulting n-type mixture directly on the p-type composite polymer layer; and (d) stripping away the n-type composite polymer layer and p-type composite polymer layer, together as a unit, from the substrate to get the electrically conducting polymer composite with p-n junctions.

In step (a), the substrate is, opportunely, made from at least one of glass, quartz, silicon, metal, and oxidized aluminum;

In step (b) the substrate is coated with the p-type composite polymer layer 14 that includes the CNTs 144 and the second polymer 142. The CNTs 144 and a liquid pre-polymer, used to help yield the second polymer 142, are mixed in specific ratios. An amount of cross-linking agent is then injected into the mixture. The substrate is finally coated with the p-type mixture, which now includes the CNTs 144 and the liquid pre-polymer material and the cross-linking agent of the second polymer 142. The p-type composite polymer layer 14 in solid state is obtained after solidification and/or curing of the components of the second polymer 142 (potentially aided by heat and/or UV exposure).

The second polymer 142 can, advantageously, be made from silicone rubber. The component of tetraethoxysilane (TEOS) is used as a cross-linking agent. The weight fraction of the CNTs 144 is about 0.1-4 wt % in this chosen embodiment.

The CNTs 144 are, usefully, refined using an oxidizing acid to reduce the metal CNTs and amorphous and to enhance the electrical properties before mixing. The procedures of this detailed embodiment are described below. The CNTs 144, in a weight fraction of approximately 1:5-1:100, are mixed with an oxidizing acid under ultrasonic oscillation for about 0.5-100 hours. The oxidizing acid can, rather suitably, be nitric acid, sulfuric acid, or their mixture. Boiling with an oxidizing acid for about 1-10 minutes, cleaning and/or filtrating also can also be used in processing the CNTs 144.

The CNTs 144 and the pre-polymer of silicone rubber can be well mixed by ball milling and/or ultrasonic oscillation to enhance the dispersion of the CNTs in the pre-polymer of silicone rubber. The CNTs 144 and pre-polymer of silicone rubber are, advantageously, mixed for about 4 hours in a ball milling machine to obtain a suspension of the two components. Another method is that the petroleum ether can be used as a dispersant in ultrasonic oscillation to obtain a suspension of the CNTs 144 and the pre-polymer of silicone rubber. The pre-polymer is treated with ultrasound for 0.5-4 hours with the CNTs 144. The liquid mixture of pre-polymer and the CNTs 144, after ball milling and/or ultrasonication, have a cross-linking agent added thereto. The mixture of the pre-polymer, cross-linking agent, and the CNTs 144 is coated on the substrate. The composite polymer layers are coated by means of spin-coating, spray-coating, printing, compression molding, and/or pouring. The p-type composite polymer layer 14 is obtained after solidification (potentially, via a curing step, if need be). A thickness of p-type composite polymer layer 14 is around ten micrometers to about 0.2 millimeters, and the optimized thickness thereof is 10 micrometers.

In step (c), the n-type composite polymer layer 12 includes a first polymer material 122 and plural electrically conductive particles 124 well-dispersed and imbedded therein. The n-type composite polymer layer 12 is coated on the solidified p-type composite polymer layer 14.

The plural electronic conductive particles 124 and the liquid pre-polymer of first polymer 122 are mixed in specific ratios. An amount of cross-linking agent, as needed for polymerization, is injected into the mixture of the electronic conductive particles 124 and the liquid pre-polymer of first polymer 122, thereby resulting in an n-type mixture. The resulting n-type mixture is then applied directly on the p-type composite polymer layer 14, solidifying thereon, potentially with the help of a curing process.

The manufacturing method of n-type composite polymer layer 12 is similar to the one used in the second step to produce the p-type composite polymer layer 14, except that is mixed with the electrically conductive particles 124 instead of the CNTs 144. The thickness of n-type composite polymer layer 12 is around ten micrometers to about 0.2 millimeters. The plural electrically conductive particles 124 in this embodiment here are made from zinc oxide particles with approximately 30-50 wt %. The plural electrically conductive particles 124, however, can, potentially, be made of any sufficiently electrically conductive material.

In step (d), the electrically conducting polymer composite 10 with p-n junctions is obtained by stripping away the n-type composite polymer layer 12 and p-type composite polymer layer 14, together as a unit, from the substrate. The electrically conducting polymer composite with p-n junctions 10, formed via the present method, is made structurally stable and compact, in large part, by the composites of p-type and n-type composite polymer layers 14 and 12. Steps (b) and (c) of the manufacturing method of the electrically conducting polymer composite with p-n junctions 10 can switch positions, in sequence (i.e., with layer 12, instead, being formed directly on the substrate).

Figure 3:
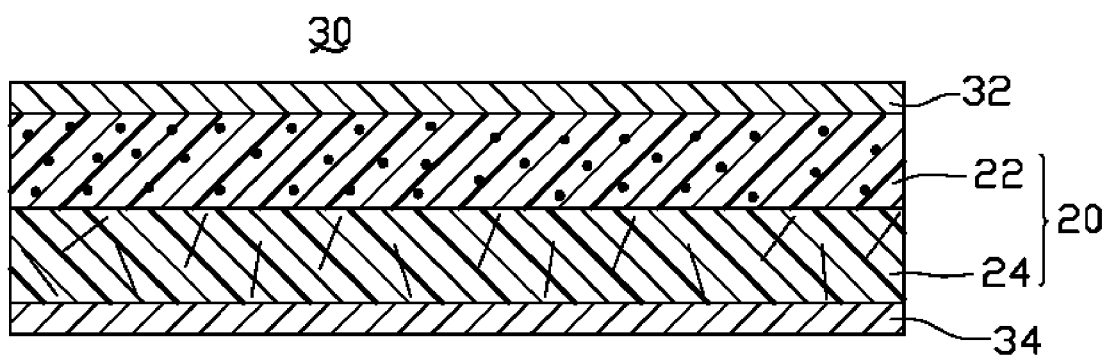
FIG. 3 is a schematic, cutaway view of a polymer composite diode, incorporating the conducting polymer composite p-n junction of FIG. 1.

Referring to FIG. 3, an polymer composite diode 30, incorporating organic p-n junctions 20, are provided.

The polymer composite diode 30 includes a cathode 32, an anode 34, and an organic p-n junction composite 20, positioned between the cathode/anode. The organic p-n junction composite 20 includes a p-type polymer layer 24 and an n-type polymer layer 22 combined together. The materials used for the organic p-n junction composite 20 are the same as the aforementioned polymer p-n junction composite 10. The cathode 32 is deposited on the n-type polymer layer 22, and they become an ohmic contact. The ohmic contact is a region on a semiconductor device that has been prepared so that the current-voltage (I-V) curve chart of the device is linear and symmetric. The anode 34 is deposited on the p-type polymer layer 24, and they also become an ohmic contact.

The materials of anode 34 and cathode 32 are, beneficially, made from gold, but they also can be made of another conductive metal and/or alloy (e.g., copper, aluminum). The method of manufacturing the organic p-n junction composite 20 is identical to the one used to produce the polymer p-n junction composite 10. The method of manufacturing the polymer composite diode 30 in this embodiment further includes the steps of depositing the cathode 32 on the n-type polymer layer 22 and depositing the anode 34 on the p-type polymer layer 24, e.g., both via vacuum evaporation.

Figure 4:
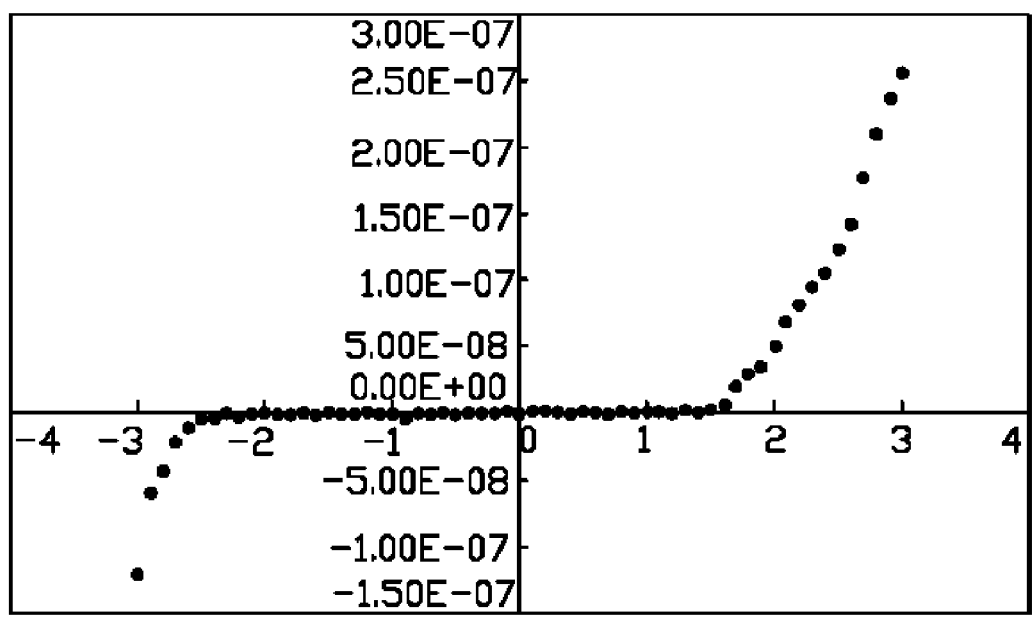
FIG. 4 is a current-voltage (I-V) curve chart of the polymer composite diode of FIG. 3.

Referring to FIG. 4, the current-voltage (I-V) curve of this embodiment demonstrates the well rectification in the range of 1-4 voltage for the organic composite diode 30.

Another variation of the method of manufacturing the polymer composite diode 30 is available. The anode 34 is deposited on a substrate; the anode 34 is coated on the p-type and n-type polymer layers 24 and 22, in turn; the cathode 32 is deposited on the n-type polymer layer 22; and the polymer composite diode 30 can be obtained by removing the four-layer element from the substrate.

Compared to the related art, the organic p-n junction composite 20 can be produced by film fabrication, such as spin-coating, printing, etc., to reduce the number of procedures involved in large-scale manufacturing. The p-n junction 20 has advantages of good properties of conductivity and mechanics via using well-dispersed CNTs. The organic p-n junction composite 20 and the polymer composite diode 30 have a potential application in various semiconductor devices.

Finally, it is to be understood that the above-described embodiments are intended to illustrate rather than limit the invention. Variations may be made to the embodiments without departing from the spirit of the invention as claimed. The above-described embodiments illustrate the scope of the invention but do not restrict the scope of the invention.

What is claimed is:

1. An electrically conducting polymer composite p-n junction, comprising:
    an electron-doped, n-type polymer composite layer comprising a first polymer material and a plurality of electrically conductive particles dispersed and imbedded therein; and
    a hole-doped, p-type polymer composite layer comprising a second polymer material and a plurality of carbon nanotubes (CNTs) dispersed and imbedded therein, the p-type polymer composite layer being disposed in contact with the n-type polymer composite layer;
    wherein the first polymer in the n-type composite polymer layer and the second polymer in the p-type composite polymer layer are each comprised of at least one material selected from the group consisting of polyethylene-ethylene glycol (PE-EG), polyethylene terephthalate (PET), silicone, epoxy resin, anaerobic glue, and acrylic glue.

2. The polymer composite p-n junction as claimed in claim 1, wherein the first polymer in the n-type composite polymer layer and the second polymer in the p-type composite polymer layer are made of identical materials.

3. The polymer composite p-n junction as claimed in claim 1, wherein the weight fraction of particles in the n-type polymer composite layer is approximately 30-50 wt %.

4. The polymer composite p-n junction as claimed in claim 1, wherein the weight fraction of CNTs in the p-type polymer composite layer is about 0.01-30 wt %.

5. The polymer composite p-n junction as claimed in claim 1, wherein the lengths of the CNTs are in an approximate range from 200 nanometers to 20 micrometers, and the diameters of the CNTs are in the range of approximately 0.5-200 nanometers.

* * * * *